(12) United States Patent
Choi et al.

(10) Patent No.: US 11,004,872 B2
(45) Date of Patent: May 11, 2021

(54) DISPLAY SUBSTRATE INCLUDING A NANO-IMPRINT PATTERN AND METHOD OF MANUFACTURING THE SAME

(71) Applicant: SAMSUNG DISPLAY CO., LTD., Yongin-si (KR)

(72) Inventors: Nakcho Choi, Yongin-si (KR); Suwan Woo, Suwon-si (KR); Yeogeon Yoon, Suwon-si (KR); Dae-Young Lee, Seoul (KR); Joonggun Chong, Yongin-si (KR); Jonghak Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 30 days.

(21) Appl. No.: 15/489,783

(22) Filed: Apr. 18, 2017

(65) Prior Publication Data
US 2018/0006057 A1    Jan. 4, 2018

(30) Foreign Application Priority Data
Jul. 4, 2016    (KR) .......................... 10-2016-0084170

(51) Int. Cl.
*H01L 27/12*    (2006.01)
*H01L 29/423*    (2006.01)
(Continued)

(52) U.S. Cl.
CPC ........ *H01L 27/124* (2013.01); *H01L 21/7682* (2013.01); *H01L 27/1248* (2013.01);
(Continued)

(58) Field of Classification Search
CPC ............... H01L 27/124; H01L 21/7682; H01L 29/4991; H01L 2221/1042;
(Continued)

(56) References Cited

U.S. PATENT DOCUMENTS 6,565,763 B1 *   5/2003   Asakawa ............... B82Y 10/00
                                                     216/22
7,855,123 B2 * 12/2010   Lee .................... H01L 21/02118
                                                     257/E21.573
(Continued)

FOREIGN PATENT DOCUMENTS

KR    10-2009-0080738 A    7/2009

OTHER PUBLICATIONS

Chen et al., Fabrication of organic thin film transistors with the nano-groove Al gate electrodes by using UV nano imprint technology, Microelectronic Engineering 98 (2012) 155-158 (Year: 2012).*

*Primary Examiner* — Shih Tsun A Chou
(74) *Attorney, Agent, or Firm* — Kile Park Reed & Houtteman PLLC

(57) ABSTRACT

A display substrate and a method of manufacturing a display substrate, the display substrate including a base substrate; a gate electrode on the base substrate; an insulation layer on the gate electrode; a source electrode and a drain electrode on the insulation layer and overlapping the gate electrode; and a pixel electrode electrically connected to the drain electrode, wherein a cavity is formed between the gate electrode and the insulation layer.

4 Claims, 28 Drawing Sheets

(51) Int. Cl.
  *H01L 29/66* (2006.01)
  *H01L 29/786* (2006.01)
  *H01L 21/768* (2006.01)

(52) U.S. Cl.
  CPC .... *H01L 27/1262* (2013.01); *H01L 29/42384* (2013.01); *H01L 29/66969* (2013.01); *H01L 29/7869* (2013.01); *H01L 2029/42388* (2013.01); *H01L 2221/1047* (2013.01)

(58) Field of Classification Search
  CPC ......... H01L 2221/1047; H01L 27/1292; H01L 29/42384; H01L 29/7869
  See application file for complete search history.

(56) References Cited

U.S. PATENT DOCUMENTS

| | | | |
|---|---|---|---|
| 8,334,547 B2* | 12/2012 | Tsutsumi | H01L 31/022491 257/99 |
| 8,450,789 B2 | 5/2013 | Bicksler et al. | |
| 8,642,252 B2 | 2/2014 | Clevenger et al. | |
| 8,866,297 B2 | 10/2014 | Tsai et al. | |
| 9,444,012 B2* | 9/2016 | Asakawa | H01L 33/38 |
| 2002/0090791 A1* | 7/2002 | Doyle | H01L 21/31155 438/396 |
| 2004/0096593 A1* | 5/2004 | Lukas | C23C 16/401 427/558 |
| 2011/0090183 A1* | 4/2011 | Yamazaki | G09G 3/3614 345/204 |
| 2012/0223311 A1* | 9/2012 | Endo | H01L 29/7869 257/57 |
| 2014/0332854 A1* | 11/2014 | Shih | H01L 29/7371 257/197 |
| 2014/0349481 A1 | 11/2014 | Tsai et al. | |
| 2014/0375920 A1* | 12/2014 | Bae | G02F 1/136259 349/42 |
| 2015/0162277 A1 | 6/2015 | Zhang et al. | |
| 2015/0214092 A1 | 7/2015 | Purayath et al. | |
| 2015/0221541 A1 | 8/2015 | Nemani et al. | |
| 2015/0287799 A1* | 10/2015 | Murashige | H01L 29/45 349/46 |
| 2016/0248038 A1* | 8/2016 | Philippens | H01L 23/544 |
| 2016/0329242 A1* | 11/2016 | Oszinda | H01L 21/76831 |
| 2016/0351724 A1* | 12/2016 | Zhao | H01L 29/786 |
| 2017/0000358 A1* | 1/2017 | Bae | G01K 7/16 |

* cited by examiner

DISPLAY SUBSTRATE INCLUDING A NANO-IMPRINT PATTERN AND METHOD OF MANUFACTURING THE SAME

CROSS-REFERENCE TO RELATED APPLICATION

Korean Patent Application No. 10-2016-0084170, filed on Jul. 4, 2016, in the Korean Intellectual Property Office, and entitled: "Display Substrate and Method of Manufacturing the Same," is incorporated by reference herein in its entirety.

BACKGROUND

1. Field

Embodiments relate to a display substrate and a method of manufacturing the display substrate.

2. Description of the Related Art

As demands on various type of display devices have recently increased with the development of an information society, studies on display devices, such as a liquid crystal display (LCD) apparatus, a plasma display panel (PDP), a field emission display (FED) apparatus, and electrophoretic display (EPD) apparatus and an organic light emitting diode (OLED) display apparatus, have been actively conducted.

In general, a display apparatus may include a display panel and a display panel driving part. The display panel may include a plurality of gate lines, a plurality of data lines, and a plurality of sub pixels. The display panel driving part may include a gate driving part providing gate signal to the gate lines, and a data driving part providing data voltages to the data lines.

SUMMARY

Embodiments are directed to a display substrate and a method of manufacturing the display substrate.

The embodiments may be realized by providing a display substrate including a base substrate; a gate electrode on the base substrate; an insulation layer on the gate electrode; a source electrode and a drain electrode on the insulation layer and overlapping the gate electrode; and a pixel electrode electrically connected to the drain electrode, wherein a cavity is formed between the gate electrode and the insulation layer.

The gate electrode may include a nano-imprint pattern in an upper surface thereof, and the cavity may be defined by the nano-imprint pattern in the upper surface of the gate electrode and the insulation layer overlapping the gate electrode.

A width of the cavity may be equal to or greater than 10 nanometers and is equal to or less than 100 nanometers.

A height of the cavity may be equal to or greater than 10 nanometers and is equal to or less than 1,000 nanometers.

The insulation layer may include a nano-imprint pattern in a portion of a lower surface thereof that overlaps the gate electrode, and the cavity may be defined by the gate electrode and the nano-imprint pattern in the lower surface of the insulation layer.

A width of the cavity may be equal to or greater than 10 nanometers and is equal to or less than 100 nanometers.

A height of the cavity may be equal to or greater than 10 nanometers and is equal to or less than 1,000 nanometers.

The insulation layer may include a nano-imprint pattern in a whole lower surface of the insulation layer, and the cavity may be defined by the gate electrode and the nano-imprint pattern in the lower surface of the insulation layer and the base substrate and the nano-imprint pattern formed in the lower surface of the insulation layer.

A width of the cavity may be equal to or greater than 10 nanometers and is equal to or less than 100 nanometers.

A height of the cavity may be equal to or greater than 10 nanometers and is equal to or less than 1,000 nanometers.

The embodiments may be realized by providing a method of manufacturing a display substrate, the method including forming a gate electrode on a substrate; forming a cavity; forming an insulation layer on the cavity; forming a source electrode and a drain electrode on the insulation layer such that the source electrode and the drain electrode overlap the gate electrode; and forming a pixel electrode that is electrically connected to the drain electrode.

Forming the cavity may include forming a nano-imprint pattern in an upper surface of the gate electrode.

A width of the cavity may be equal to or greater than 10 nanometers and is equal to or less than 100 nanometers.

A height of the cavity may be equal to or greater than 10 nanometers and is equal to or less than 1,000 nanometers.

Forming the cavity may include forming a sub insulation layer including a nano-imprint pattern in an area overlapping the gate electrode.

A width of the cavity may be equal to or greater than 10 nanometers and is equal to or less than 100 nanometers.

A height of the cavity may be equal to or greater than 10 nanometers and is equal to or less than 1,000 nanometers.

Forming the cavity may include forming a sub imprint pattern including a nano-imprint pattern formed on a whole of the substrate on which the gate electrode is formed.

A width of the cavity may be equal to or greater than 10 nanometers and is equal to or less than 100 nanometers.

A height of the cavity may be equal to or greater than 10 nanometers and is equal to or less than 1,000 nanometers.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
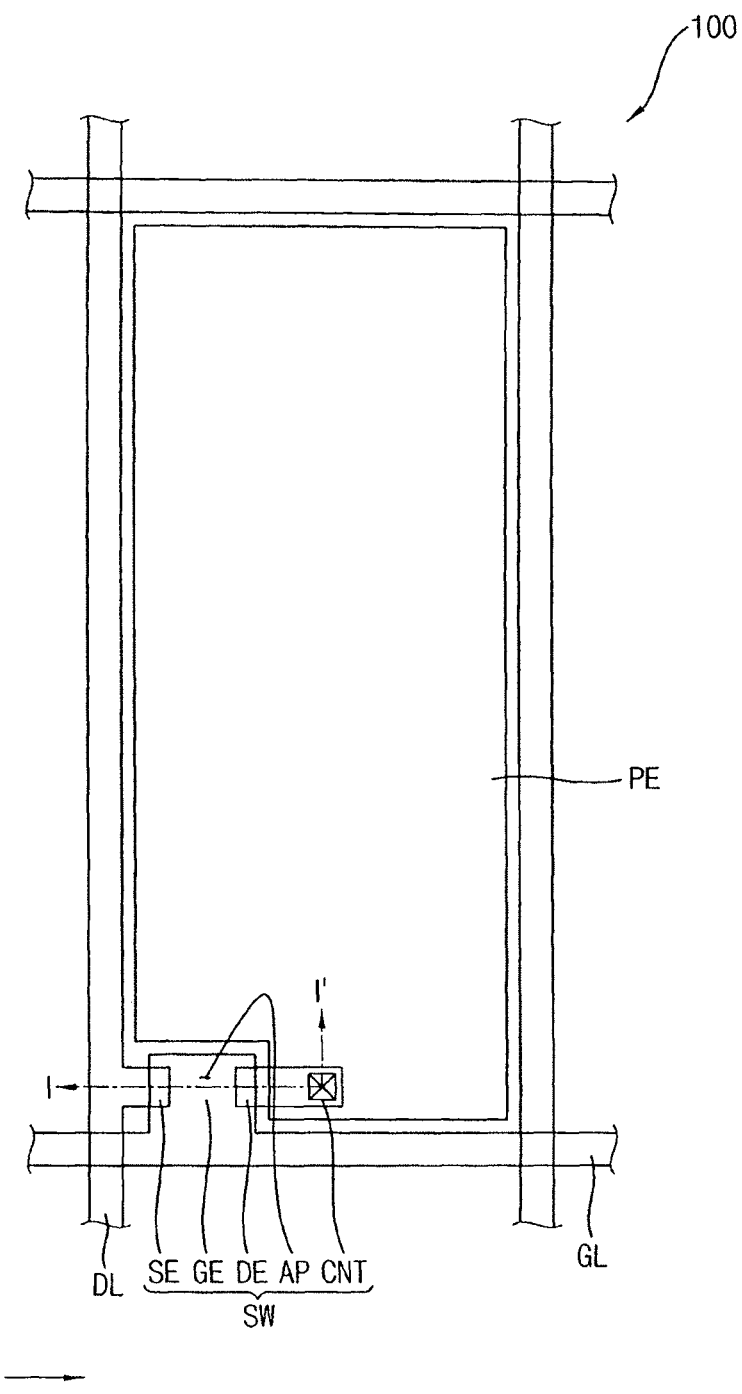
FIG. 1 illustrates a plan view of a display substrate according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. As used herein, the term "or" is not an exclusive term such that "A or B" includes all combinations thereof, i.e., A, B, or A and B. Like reference numerals refer to like elements throughout.

Figure 2:
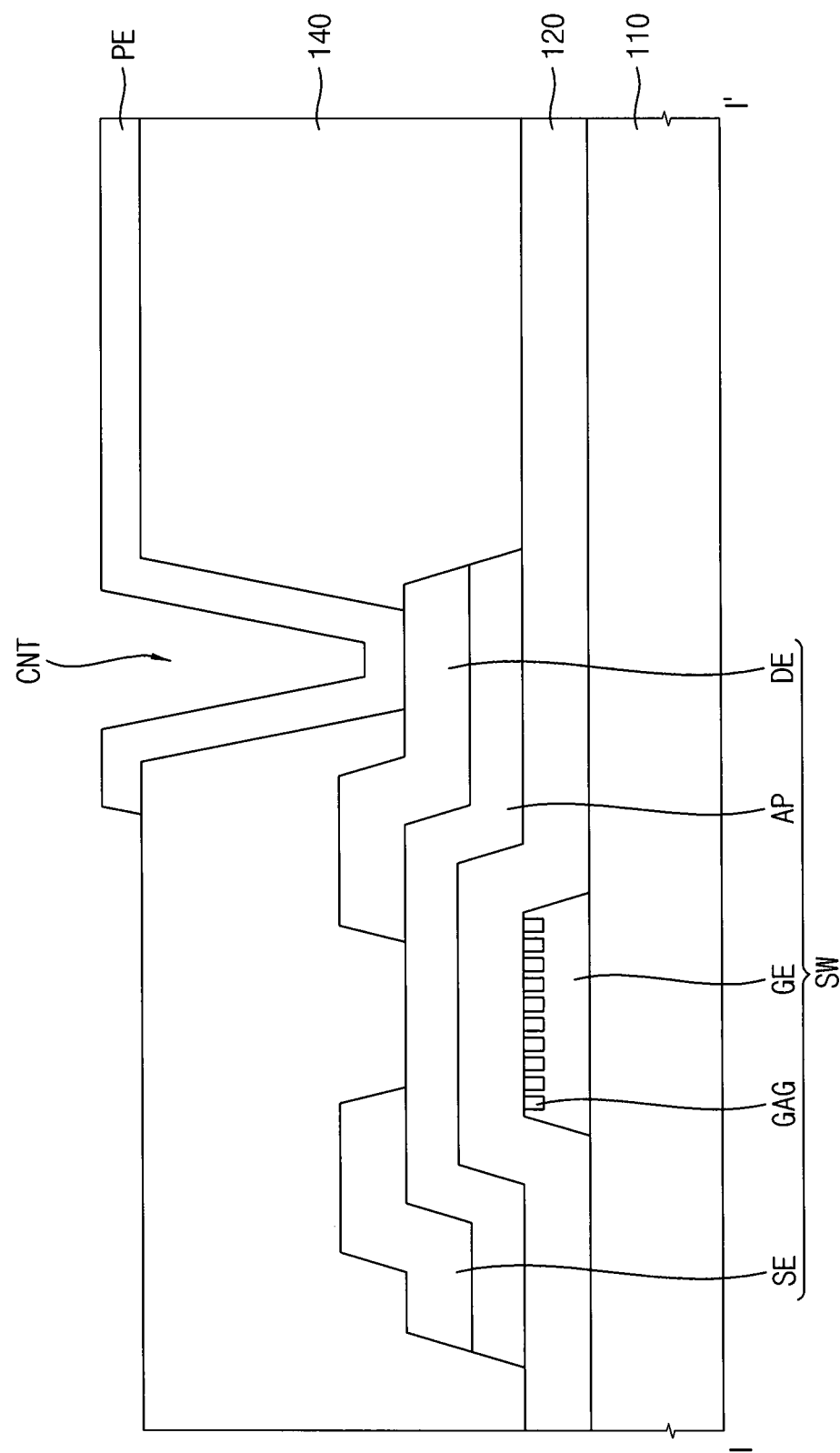
FIG. 2 illustrates a cross-sectional view taken along a line I-I' of FIG. 1.

FIG. 1 illustrates a plan view of a display substrate according to an exemplary embodiment. FIG. 2 illustrates a cross-sectional view taken along a line I-I' of FIG. 1.

Referring to FIGS. 1 and 2, the display substrate 100 according to the present exemplary embodiment may include a gate line GL, a data line DL crossing the gate line GL, a thin film transistor SW (which is a switching device), and a pixel electrode PE. The thin film transistor SW may be connected to the gate line GL and the data line DL. The pixel electrode PE may be connected to the thin film transistor SW through a contact hole CNT.

The gate line GL may extend in a first direction D1. In an implementation, the gate line GL may have a single layer structure including, e.g., copper (Cu), silver (Ag), chromium (Cr), molybdenum (Mo), aluminum (Al), titanium (Ti), manganese (Mn), or a mixture thereof. In an implementation, the gate line GL may have a multi layer structure having a plurality of metal layers including materials different from each other. The gate line GL may be electrically connected to a gate electrode GE of the thin film transistor SW. A portion of the gate line GL may form the gate electrode GE.

The gate electrode GE may include a nano-imprint pattern on an upper surface thereof (e.g., on a surface facing away from the base substrate 110). A gate insulation layer 120 and the nano-imprint pattern on the upper surface of the gate electrode GE may define a cavity. For example, the cavity may be formed between the gate electrode GE and the gate insulation layer 120. For example, the cavity may be between the gate electrode GE and the gate insulation layer 120 by extending into the gate electrode GE. For example, the cavity may include a plurality of discontinuous or individual cavities or a continuous cavity.

A width of the cavity (e.g., the width of each cavity in the first direction D1 or a direction parallel with a planar surface of the base substrate 110) may be equal to or greater than 10 nanometers and may be equal to or less than 100 nanometers (e.g., may be about 10 nm to about 100 nm). A height of the cavity (e.g., in a direction orthogonal to the planar surface of the base substrate) may be equal to or greater than 10 nanometers and may be equal to or less than 1,000 nanometers (e.g., may be about 10 nm to about 1,000 nm).

The gate insulation layer 120 may be formed on the gate line GL and the gate electrode GE. The gate insulation layer 120 may include an inorganic material. For example, the gate insulation layer 120 may include silicon oxide (SiOx) and/or silicon nitride (SiNx). In an implementation, the gate insulation layer 120 may include silicon oxide (SiOx), and may have a thickness of about 500 Å. In an implementation, the gate insulation layer 120 may include a plurality of layers including materials different from each other.

An active pattern AP may be formed on the gate insulation layer 120. The active pattern AP may include an oxide semiconductor. For example, the oxide semiconductor may include zinc oxide (ZnO), zinc tin oxide (ZTO), zinc indium oxide (ZIO), indium oxide (InO), titanium oxide (TiO), indium gallium zinc oxide (IGZO), or indium zinc tin oxide (IZTO). The above-mentioned materials may be used as a single or may be mixed and used. In an implementation, the oxide semiconductor may include indium gallium zinc oxide.

A source metal pattern may be formed on the active pattern AP. The source metal pattern may include the data line DL, a source electrode SE, and a drain electrode DE. The data line DL may be electrically connected to the source electrode SE. For example, the source electrode SE may protrude from the data line DL in the first direction D1. The data line DL may be formed on a layer on which the source electrode SE and the drain electrode DE are formed.

An organic layer 140 may be formed on the source electrode SE and the drain electrode DE. The organic layer 140 may substantially planarize an upper surface of the display substrate 100 so that issues that may otherwise be a concern due to a step (such as disconnection of a signal line) may be reduced and/or prevented. The organic layer 140 may be an insulation layer including an organic material. In an implementation, the organic layer 140 may a color filter layer. When the organic layer 140 is a color filter layer, the color filter layer may be a red color filter layer, a green color filter layer, a blue color filter layer, or a white color filter layer.

The pixel electrode PE may be formed on the organic layer 140. The pixel electrode PE may include a transparent conductive material. In an implementation, the pixel electrode PE may include indium tin oxide (ITO) or indium zinc oxide (IZO). In an implementation, the pixel electrode PE may include titanium (Ti) and/or molybdenum titanium (MoTi). The pixel electrode PE may be electrically connected to the drain electrode DE through the contact hole CNT.

FIGS. 3 to 12 illustrate cross-sectional views of stages in a method of manufacturing the display substrate 100 of FIG. 2.

Figure 3:
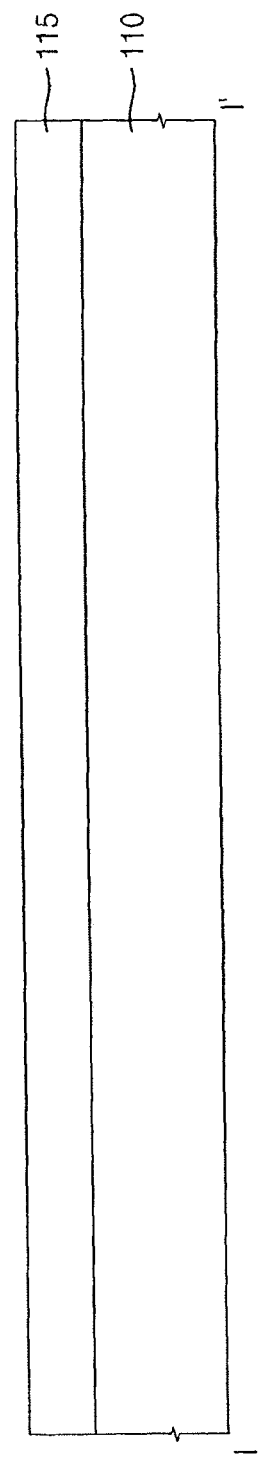
FIGS. 3 to 12 illustrate cross-sectional views of stages in a method of manufacturing the display substrate of FIG. 2.

Referring to FIG. 3, a gate metal layer 115 may be formed on a base substrate 110.

A glass substrate, a quartz substrate, a silicon substrate, a plastic substrate, or the like may be used as the base substrate 110.

The gate metal layer 115 may include, e.g., copper (Cu), silver (Ag), chromium (Cr), molybdenum (Mo), aluminum (Al), titanium (Ti), manganese (Mn), aluminum (Al), or an alloy thereof. The gate metal layer 115 may have a single layer structure or a multi layer structure having a plurality of metal layers including materials different from each other. For example, the gate metal layer 115 may include a copper layer and a titanium layer formed on an upper portion and/or a lower portion of the copper layer.

Figure 4:
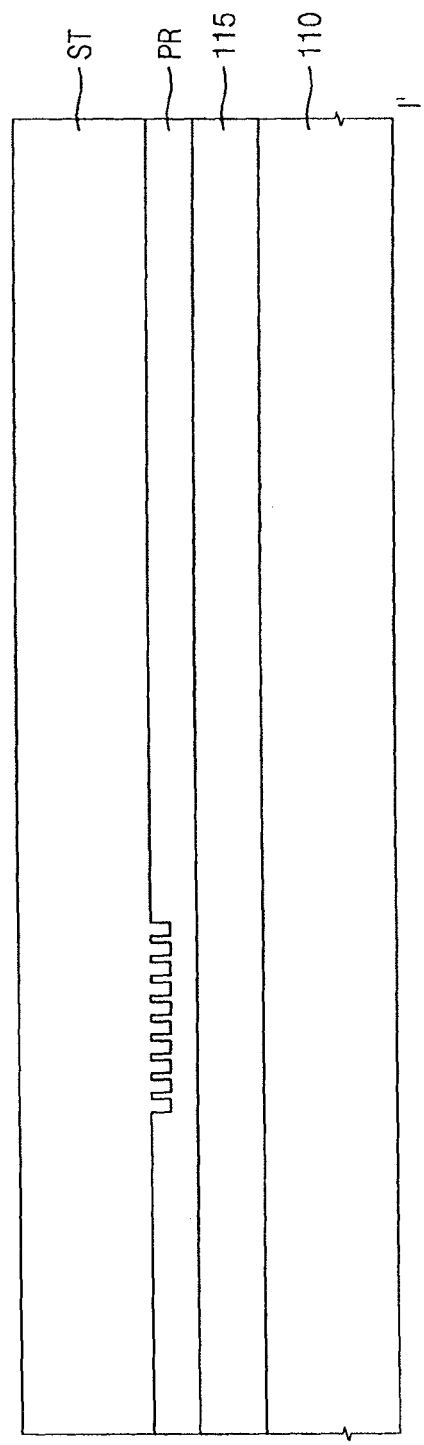

Referring to FIG. 4, a resin layer PR may be formed on the base substrate 110 on which the gate metal layer 115 is formed. A primitive or preliminary pattern may be formed using an imprint mold ST. Thus, an imprint may be progressed.

A resin solution of the resin layer PR may have low viscosity, and the primitive pattern may be formed between the imprint mold ST and the gate electrode GE by, e.g., a capillary tube phenomenon.

The imprint mold ST may include a mold pattern positioned in a portion corresponding to the gate electrode GE (e.g., aligned with or overlying where the gate electrode GE will be in the final device). The imprint mold ST may include a transparent material to transmit ultraviolet rays. The mold pattern may have a shape inverted or complementary to the primitive pattern. For example, in order to form the primitive pattern corresponding to a wire grid pattern, the mold pattern may include protrusion patterns formed in a regular interval and having the same or complementary shapes.

Next, ultraviolet rays may be emitted to the primitive pattern, and the resin solution of the primitive pattern may be hardened. The imprint mold ST may transmit the ultraviolet rays, the ultraviolet rays may reach the primitive pattern through the imprint mold ST, and thus the resin solution of the primitive pattern may be hardened. Next, the imprint mold ST may be separated from the base substrate 110, and a primitive pattern PR1 (shown in FIG. 5) may be formed.

Figure 5:
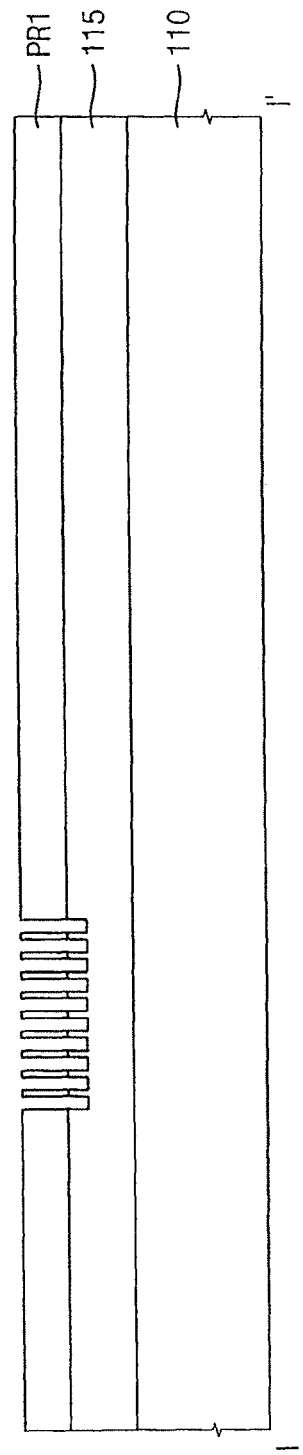

Referring to FIG. 5, the gate metal layer 115 may be etched using the primitive pattern PR1 as a mask.

The gate metal layer 115 may be etched using the primitive pattern PR1 as the mask. The etching may include performing a dry etch method. An amount control of the etching may be important. A nano-imprint pattern may be formed on an upper surface of the gate metal layer 115 by controlling the amount of the etching.

Figure 6:
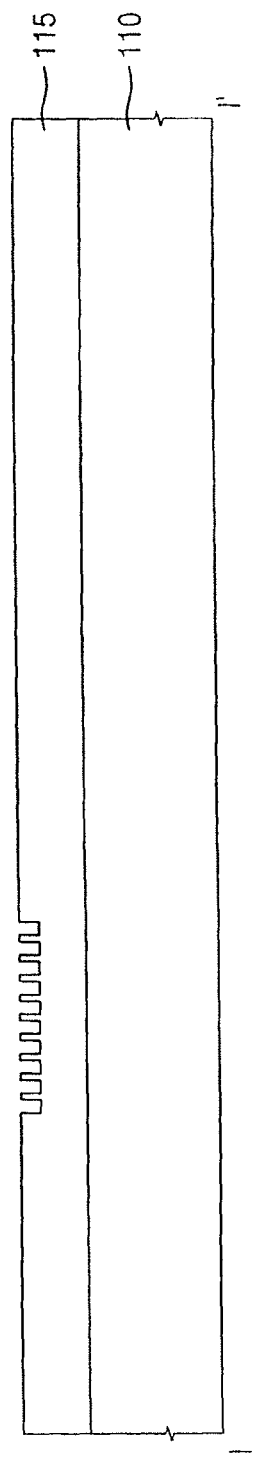

Referring to FIG. 6, the primitive pattern PR1 may be removed.

The primitive pattern PR1 may be removed. Thus, the gate metal layer 115 on which the nano-imprint pattern is formed may be exposed.

In an implementation, a width of the nano-imprint pattern formed on the gate metal layer 115 may be equal to or greater than 10 nanometers and may be equal to or less than 100 nanometers. For example, a width of each recess of the nano-imprint pattern (e.g., in a direction parallel with the planar surface of the base substrate 110) may be about 10 nm to about 100 nm. In an implementation, a height of the nano-imprint pattern formed on the gate metal layer 115 may be equal to or greater than 10 nanometers and may be equal to or less than 1,000 nanometers.

Figure 7:
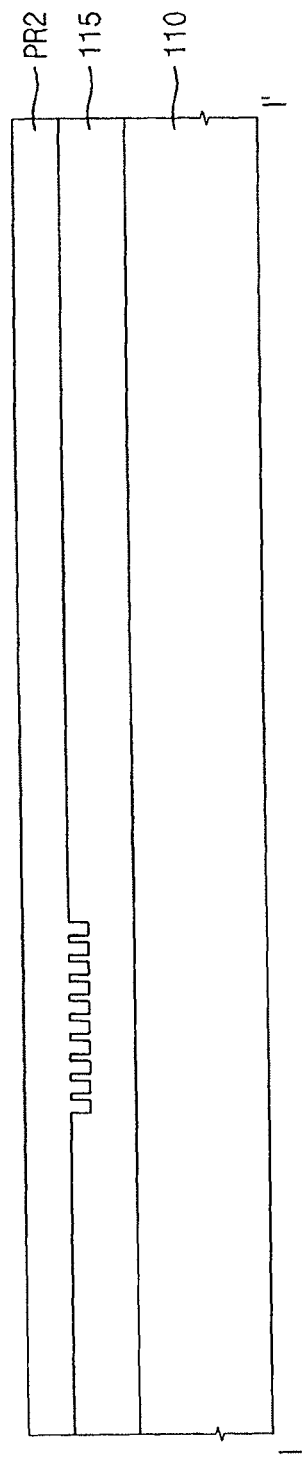
Figure 8:
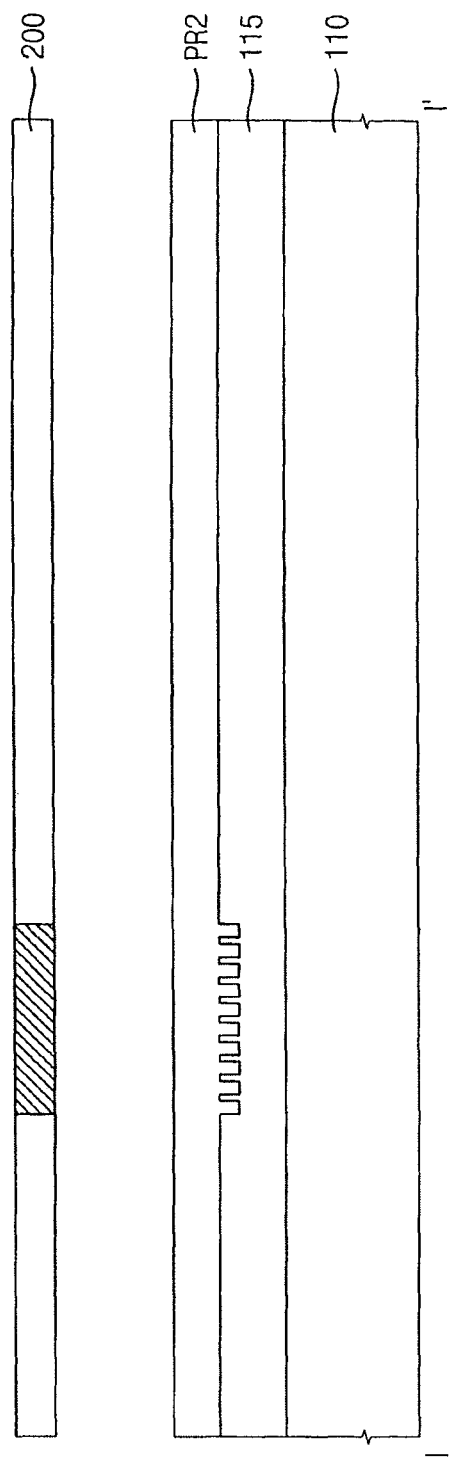

Referring to FIGS. 7 and 8, a photoresist layer PR2 may be formed on the gate metal layer 115 on which the nano-imprint pattern is formed. Next, the photoresist layer PR2 may be exposed using a mask 200.

The photoresist layer PR2 may include a positive photoresist composite. The positive photoresist composite may react with light. For example, an exposed area may be dissolved by a developer, and a blocked area may not be dissolved by the developer.

The mask 200 may include a blocking portion formed in an area corresponding to, aligned with, or overlying the gate electrode GE, and a transmitting portion formed in the remaining area.

Figure 9:
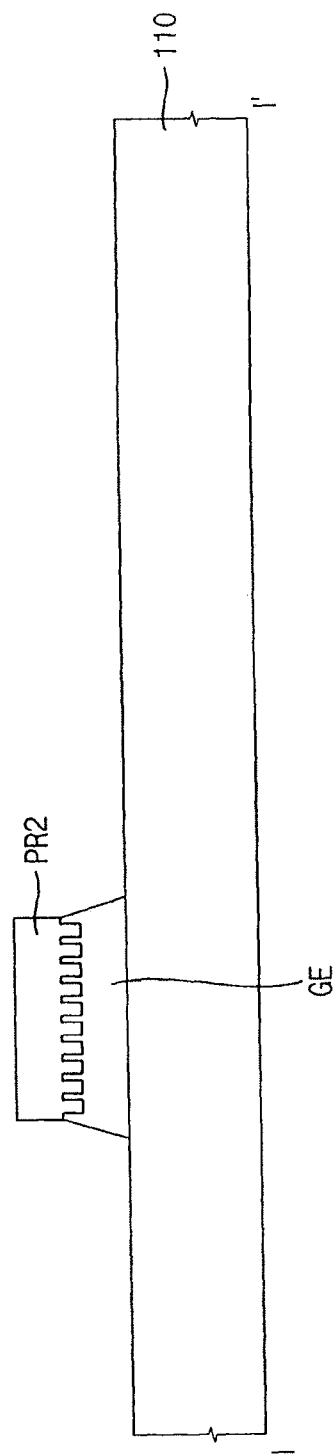
Figure 10:
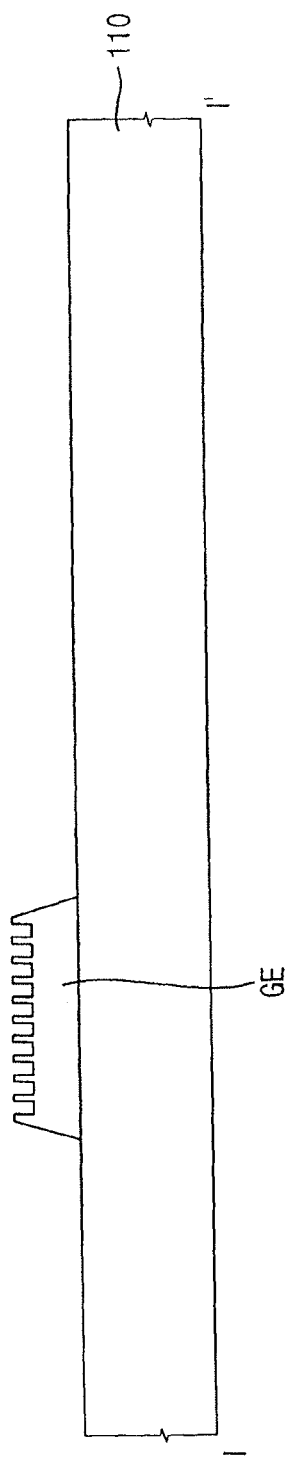

Referring to FIGS. 9 and 10, the gate electrode GE may be formed by performing a developing and an etching. Next, the photoresist layer PR2 may be removed.

After the photoresist layer PR2 is exposed using the mask 200, the gate electrode GE may be formed using the developing and the etching.

The etching may be, e.g., a wet etching. The photoresist layer PR2 may include a positive photoresist composite, and the photoresist layer PR2 may react with light. Therefore, an exposed area may be dissolved by a developer, and a blocked area may not be dissolved by the developer. Thus, the gate electrode GE may be formed in an area where light was blocked by a blocking portion. After the developing and the etching, a remaining part of photoresist layer PR2 may be removed, and the gate electrode GE may be formed.

The gate electrode GE may include the nano-imprint pattern formed on the upper surface of the gate electrode GE.

The width of the nano-imprint pattern formed on the gate electrode GE may be equal to or greater than 10 nanometers and may be equal to or less than 100 nanometers. In addition, the height of the nano-imprint pattern formed on the gate electrode GE may be equal to or greater than 10 nanometers and may be equal to or less than 1,000 nanometers.

Figure 11:
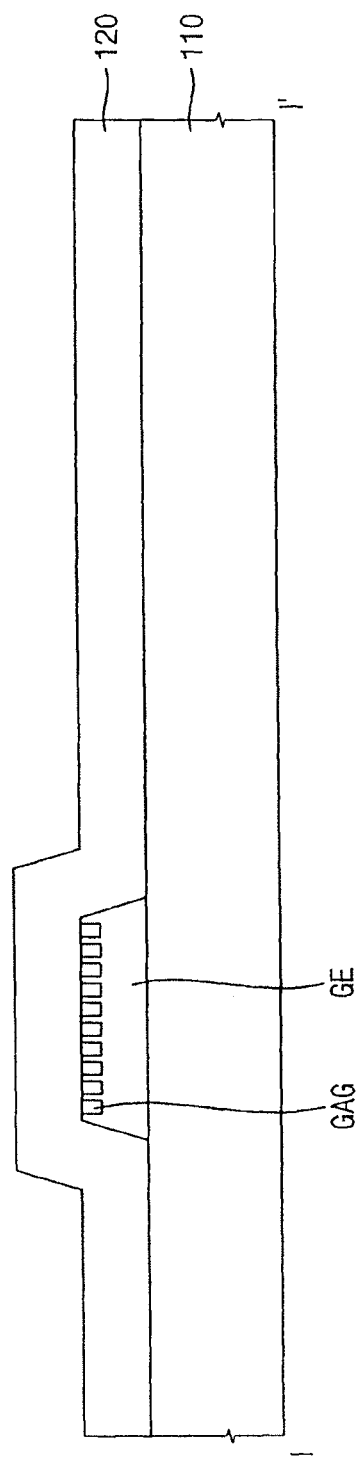

Referring to FIG. 11, the gate insulation layer 120 may be formed on the base substrate 110 on which the gate electrode GE has already been formed.

The gate insulation layer 120 may include, e.g., silicon nitride, silicon oxide, etc. The gate insulation layer 120 may have a single layer structure or a multi layer structure. For example, the gate insulation layer 120 may include a lower insulation layer having silicon nitride and an upper insulation layer having silicon oxide.

A plurality of cavities GAG may be defined by the nano-imprint pattern formed on the upper surface of the gate electrode GE and the gate insulation layer 120 overlapping the gate electrode GE.

Figure 12:
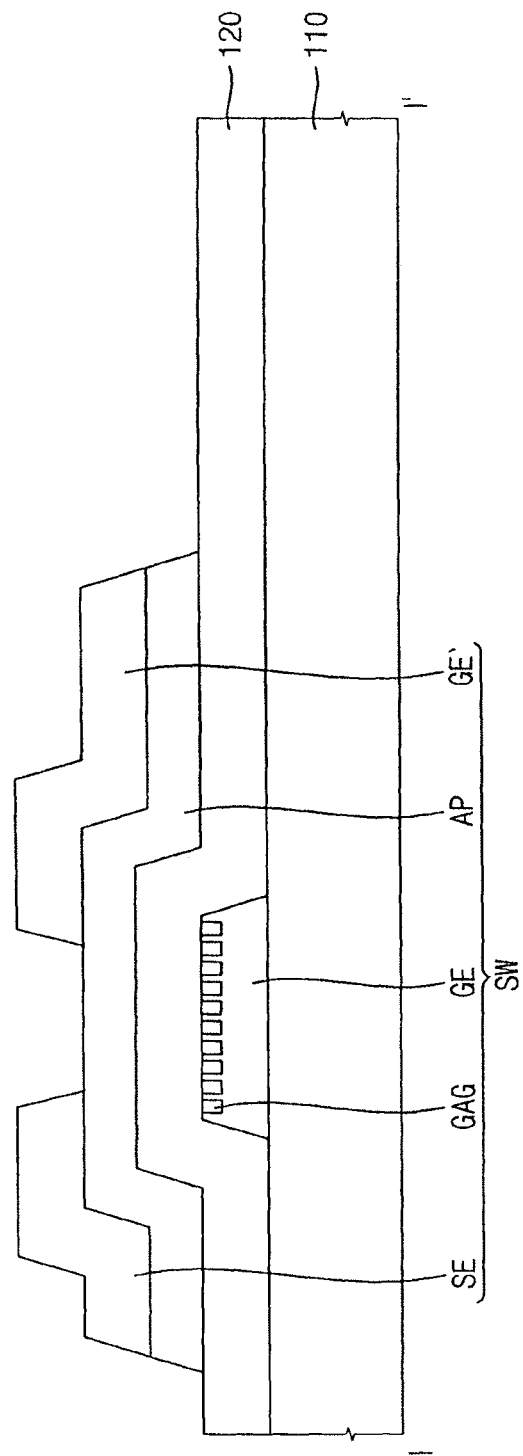

Referring to FIG. 12, the active pattern AP, the source electrode SE and the drain electrode DE may be formed on the base substrate 110 on which the gate insulation layer 120 is formed.

The active pattern AP may be formed on the gate insulation layer 120. The active pattern AP may include an oxide semiconductor. For example, the oxide semiconductor may include zinc oxide (ZnO), zinc tin oxide (ZTO), zinc indium oxide (ZIO), indium oxide (InO), titanium oxide (TiO), indium gallium zinc oxide (IGZO), or indium zinc tin oxide (IZTO). The above-mentioned materials may be used as a single or may be mixed and used. In an implementation, the oxide semiconductor may include indium gallium zinc oxide.

The source metal pattern may be formed on the active pattern AP. The source metal pattern may include the data line DL, the source electrode SE, and the drain electrode DE. The data line DL may be electrically connected to the source electrode SE. For example, the source electrode SE may protrude from the data line DL in the first direction D1. The data line DL may be formed on the layer on which the source electrode SE and the drain electrode DE are formed.

The source electrode SE and the drain electrode DE may have a single layer structure including, e.g., copper (Cu), silver (Ag), chromium (Cr), molybdenum (Mo), aluminum (Al), titanium (Ti), manganese (Mn), aluminum (Al), or an alloy thereof. In an implementation, the source electrode SE and the drain electrode DE may have a multi layer structure including a plurality of metal layers including materials different from each other.

Referring back to FIG. 2, the organic layer 140 and the pixel electrode PE may be folioed on the base substrate 110 on which the source electrode SE and the drain electrode DE are formed.

The organic layer 140 may be formed on the source electrode SE and the drain electrode DE. The organic layer 140 may substantially planarize the upper surface of the display substrate 100 so that problems due to a step such as disconnection of a signal line may be prevented. The organic layer 140 may be an insulation layer including an organic material. For example, the organic layer 140 may a color filter layer. When the organic layer 140 is a color filter layer, the color filter layer may be a red color filter layer, a green color filter layer, a blue color filter layer, or a white color filter layer.

The pixel electrode PE may be formed on the organic layer 140. The pixel electrode PE may include a transparent conductive material. For example, the pixel electrode PE may include indium tin oxide (ITO) or indium zinc oxide (IZO). In an implementation, the pixel electrode PE may include titanium (Ti) and/or molybdenum titanium (MoTi). The pixel electrode PE may be electrically connected to the drain electrode DE through the contact hole CNT.

According to the present exemplary embodiment, the cavities GAG may be defined by or result from the nano-imprint pattern formed on the upper surface of the gate electrode GE and the gate insulation layer 120 overlapping the gate electrode GE. The cavities GAG may help decrease a capacitance between the gate metal layer (including the gate electrode GE) and the data metal layer (including the source electrode SE and the drain electrode DE). Therefore, a line load between the gate metal layer and the data metal layer may be decreased, and a signal delay may be minimized.

Figure 13:
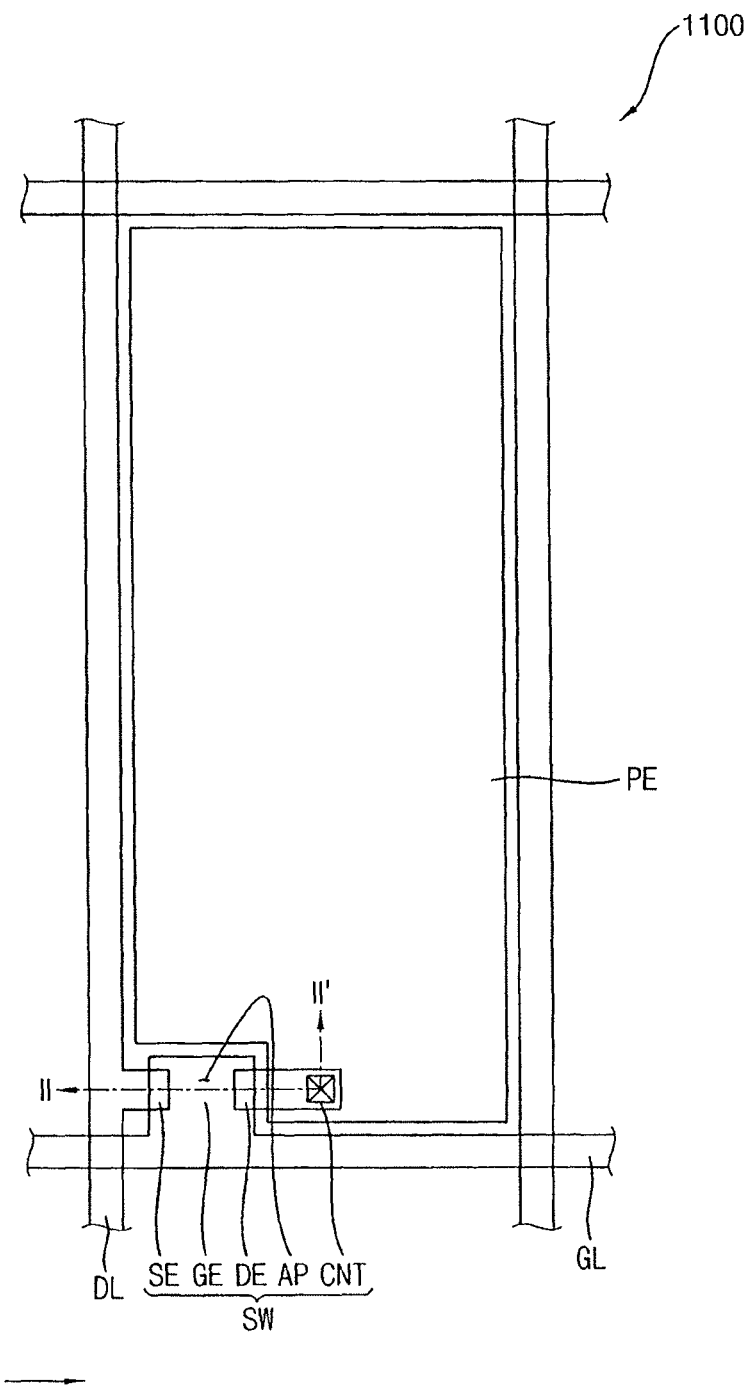
FIG. 13 illustrates a plan view of a display substrate according to an exemplary embodiment.
Figure 14:
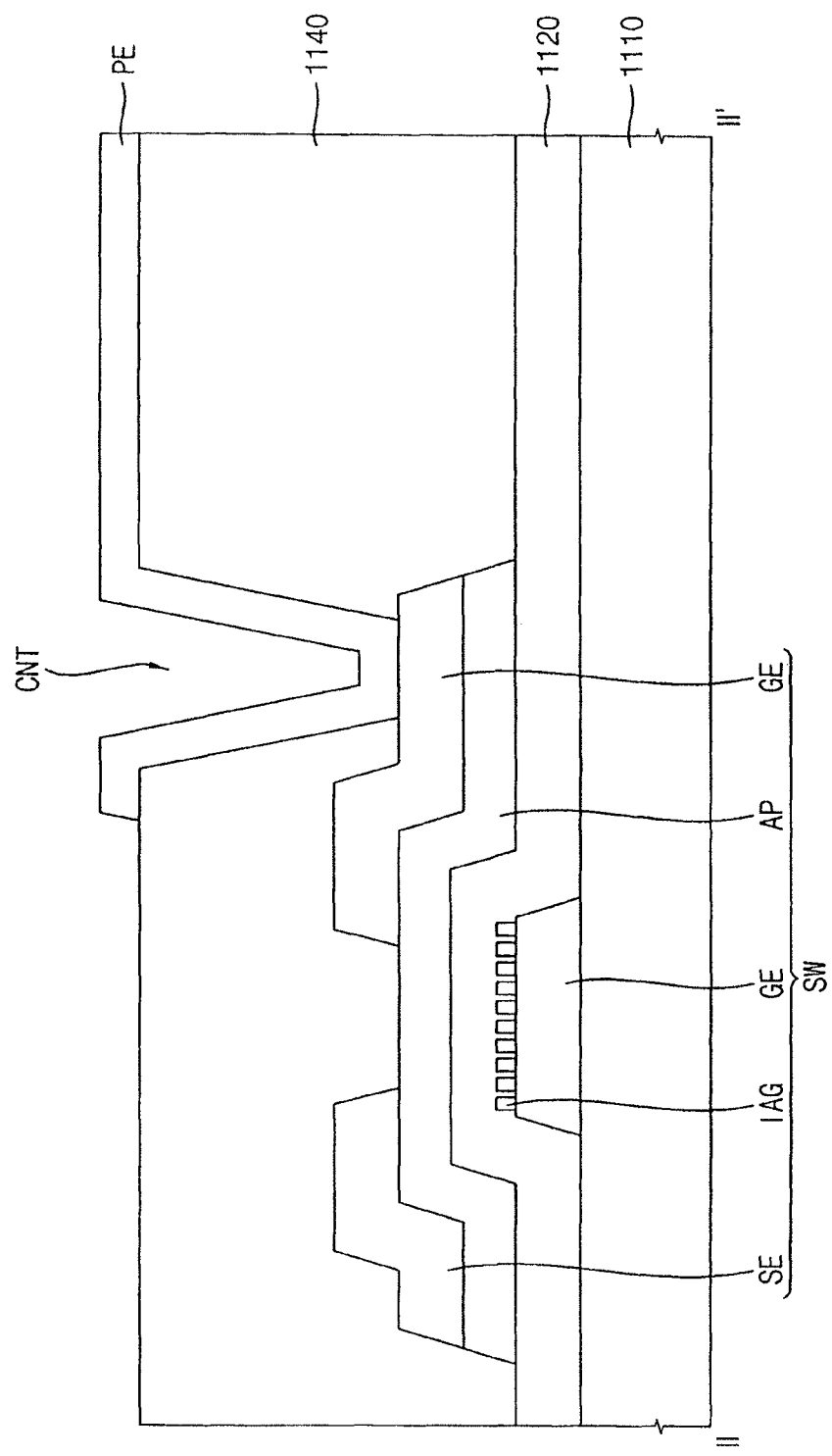
FIG. 14 illustrates a cross-sectional view taken along a line II-II' of FIG. 13.

FIG. 13 illustrates a plan view of a display substrate according to an exemplary embodiment. FIG. 14 illustrates a cross-sectional view taken along a line II-II' of FIG. 13.

The display substrate 1100 according to the present exemplary embodiment is substantially the same as the display substrate 100 according to the previous exemplary embodiment illustrated in FIGS. 1 to 12 except for a gate electrode GE and a gate insulation layer 1120. Thus, the same reference numerals will be used to refer to same or like parts as those described in the previous exemplary embodiment and any further repetitive explanation concerning the above elements may be omitted.

Referring to FIGS. 13 and 14, the display substrate 1100 according to the present exemplary embodiment may include a gate line GL, a data line DL crossing the gate line GL, a thin film transistor SW which is a switching device, and a pixel electrode PE. The thin film transistor SW may be connected to the gate line GL and the data line DL. The pixel electrode PE may be connected to the thin film transistor SW through a contact hole CNT.

The gate line GL may extend in a first direction D1. The gate line GL may have a single layer structure including, e.g., copper (Cu), silver (Ag), chromium (Cr), molybdenum (Mo), aluminum (Al), titanium (Ti), manganese (Mn), or a mixture thereof. In an implementation, the gate line GL may have a multi layer structure having a plurality of metal layers including materials different from each other. The gate line GL may be electrically connected to a gate electrode GE of the thin film transistor SW. A portion of the gate line GL may form the gate electrode GE.

The gate insulation layer 1120 may be formed on the gate line GL and the gate electrode GE. The gate insulation layer 1120 may include an inorganic material. For example, the gate insulation layer 1120 may include silicon oxide (SiOx) and/or silicon nitride (SiNx). In an implementation, the gate insulation layer 1120 may include silicon oxide (SiOx), and may have a thickness of about 500 Å. In an implementation, the gate insulation layer 1120 may include a plurality of layers including materials different from each other.

The gate insulation layer 1120 may include a nano-imprint pattern formed on a lower surface of the gate insulation layer 1120 overlapping the gate electrode GE. For example, the gate insulation layer 1120 may include the nano-imprint pattern on a base substrate facing surface thereof at a region aligned with the gate electrode GE.

The gate electrode GE and the nano-imprint pattern on the lower surface of the gate insulation layer 1120 may define a cavity. In an implementation, the cavity may be formed between the gate electrode GE and the gate insulation layer 1120 (e.g., and may extend into the gate insulation layer 1120.

A width of the cavity (e.g., of each individual recess of the cavity) may be equal to or greater than 10 nanometers and may be equal to or less than 100 nanometers. A height of the cavity may be equal to or greater than 10 nanometers and may be equal to or less than 1,000 nanometers.

FIGS. 15 to 20 illustrate cross-sectional views of stages in a method of manufacturing the display substrate 1100 of FIG. 14.

Figure 15:
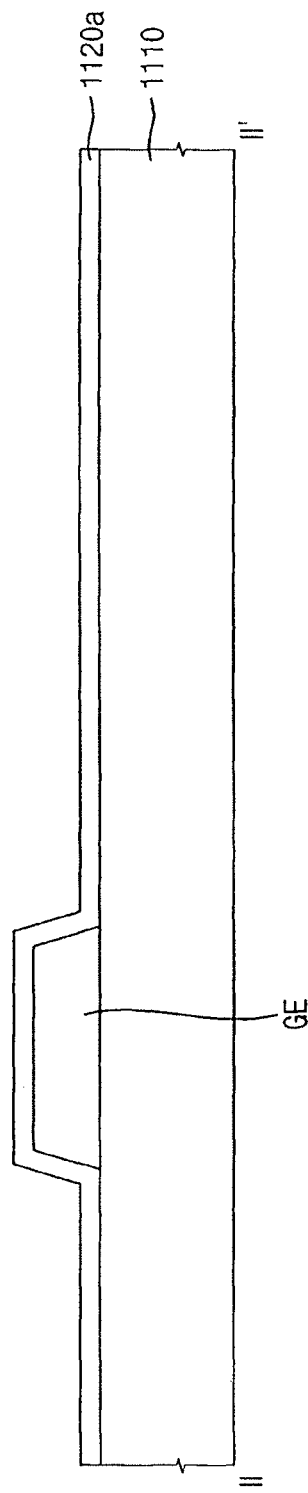
FIGS. 15 to 20 illustrate cross-sectional views of stages in a method of manufacturing the display substrate of FIG. 14.

Referring to FIG. 15, the gate electrode GE and a sub insulation layer 1120a may be formed on a base substrate 1110.

A glass substrate, a quartz substrate, a silicon substrate, a plastic substrate, or the like may be used as the base substrate 1110.

After the gate metal layer is formed on the base substrate 1110, the gate metal layer may be patterned, and thus the gate electrode GE may be formed.

The gate metal layer may include, e.g., copper (Cu), silver (Ag), chromium (Cr), molybdenum (Mo), aluminum (Al), titanium (Ti), manganese (Mn), aluminum (Al), or an alloy thereof. In an implementation, the gate metal layer may have a single layer structure or a multi layer structure having a plurality of metal layers including materials different from each other. In an implementation, the gate metal layer may include a copper layer and a titanium layer formed on an upper portion and/or a lower portion of the copper layer.

The sub insulation layer 1120a may include, e.g., silicon nitride, silicon oxide, or the like. The sub insulation layer 1120a may have a single layer structure or a multi layer structure. For example, the sub insulation layer 1120a may include a lower insulation layer having silicon nitride and an upper insulation layer having silicon oxide.

Figure 16:
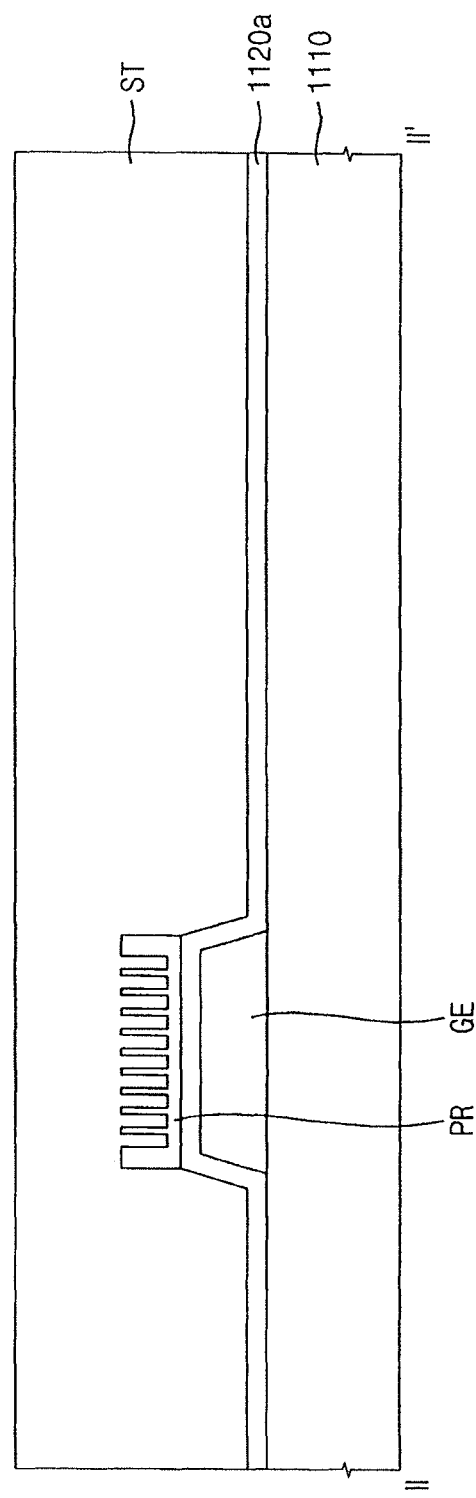

Referring to FIG. 16, a resin layer PR may be formed on the base substrate 1110 on which the gate electrode GE and the sub insulation layer 1120a are formed. A primitive pattern may be formed using an imprint mold ST. Thus, an imprint may be progressed.

A resin solution of the resin layer PR may have low viscosity, and the primitive pattern may be formed between the imprint mold ST and the sub insulation layer 1120a by a capillary tube phenomenon.

The imprint mold ST may include a mold pattern positioned in a portion corresponding to the gate electrode GE. The imprint mold ST may include a transparent material to transmit ultraviolet rays. The mold pattern may have a shape inverted or complementary to the primitive pattern. For example, in order to form the primitive pattern corresponding to a wire grid pattern, the mold pattern may include protrusion patterns formed in a regular interval and having the same shapes.

Next, ultraviolet rays may be emitted to the primitive pattern, and the resin solution of the primitive pattern may be hardened. The imprint mold ST may transmit the ultraviolet rays, the ultraviolet rays may reach the primitive pattern through the imprint mold ST, and the resin solution of the primitive pattern may be hardened. Next, the imprint mold ST may be separated from the base substrate 1110, and thus the primitive pattern may be formed.

Figure 17:
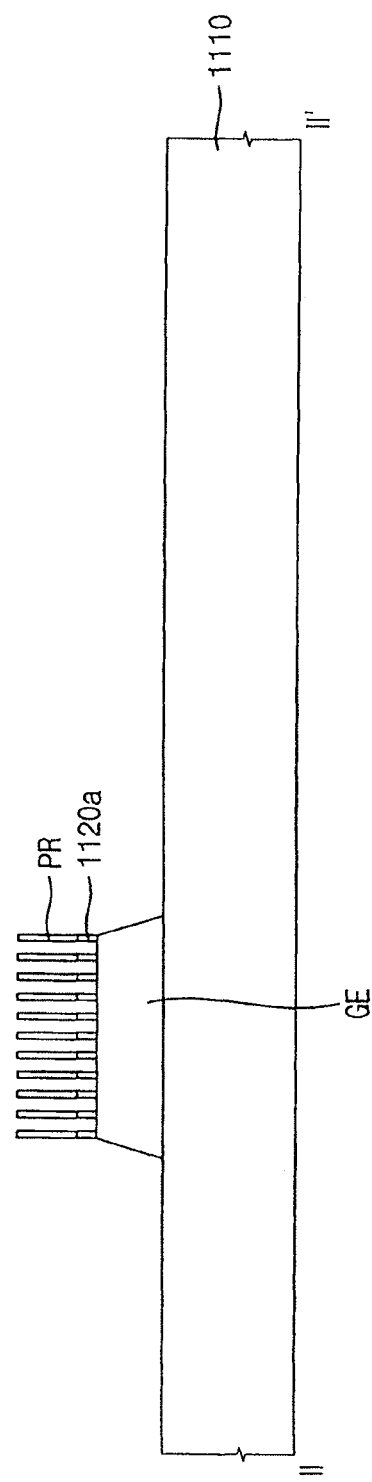

Referring to FIG. 17, the sub insulation layer 1120a may be etched using the primitive pattern PR as a mask.

The sub insulation layer 1120a is etched using the primitive pattern PR as the mask. The etching may be include performing a dry etch method. At this time, an amount control of the etching may be important. A nano-imprint pattern may be formed on the sub insulation layer 1120a by controlling the amount of the etching.

Figure 18:
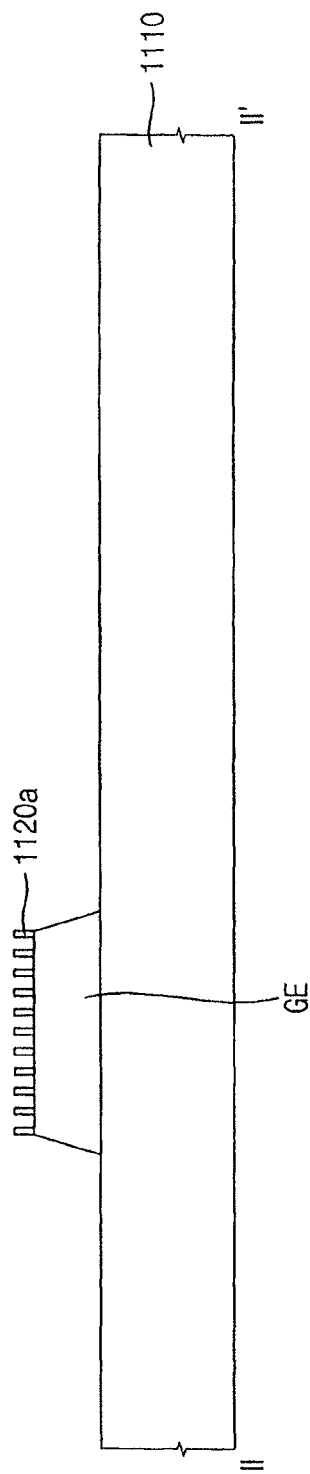

Referring to FIG. 18, the primitive pattern PR may be removed.

The primitive pattern PR may be removed. Thus, the sub insulation layer 1120a on which the nano-imprint pattern is formed may be exposed.

A width of the nano-imprint pattern formed on the sub insulation layer 1120a may be equal to or greater than 10 nanometers and may be equal to or less than 100 nanometers. For example, a width of recesses in the sub insulation layer 1120a may be about 10 nm to about 100 nm. In an implementation, a height of the nano-imprint pattern formed on the sub insulation layer 1120a may be equal to or greater than 10 nanometers and may be equal to or less than 1,000 nanometers. In an implementation, the nano-imprint pattern may be formed only on the gate electrode GE.

Figure 19:
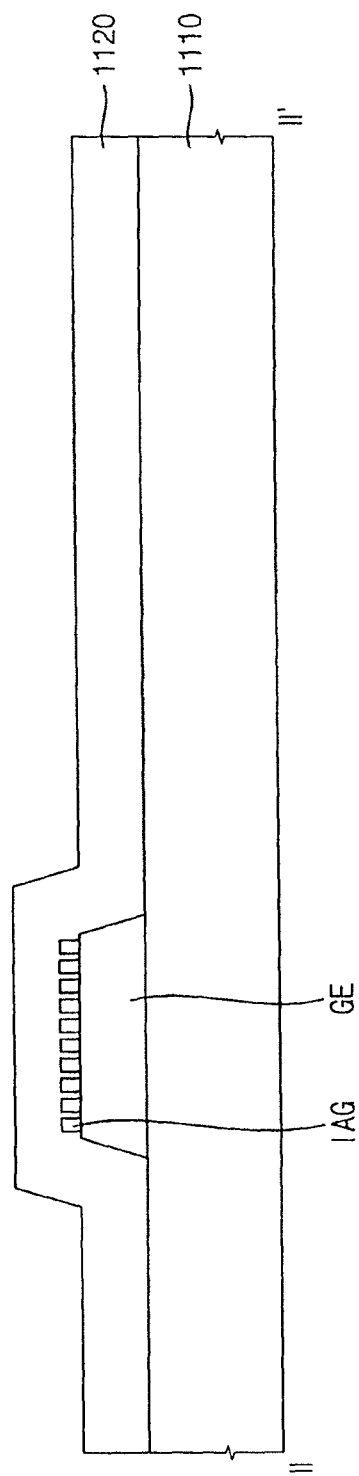

Referring to FIG. 19, the gate insulation layer 1120 may be formed on the base substrate 1110 on which the nano-imprint pattern has been formed. The gate insulation layer 1120 may include, e.g., silicon nitride, silicon oxide, or the like. The gate insulation layer 1120 may have a single layer structure or a multi layer structure. In an implementation, the gate insulation layer 1120 may include a lower insulation layer having silicon nitride and an upper insulation layer having silicon oxide.

A plurality of cavities IAG may be defined by the gate electrode GE and the nano-imprint pattern formed on or in the lower surface of the gate insulation layer 1120.

In an implementation, the width of the cavity IAG (e.g., width of each cavity) may be equal to or greater than 10 nanometers and may be equal to or less than 100 nanometers. In an implementation, the height of the cavity IAG may be equal to or greater than 10 nanometers and may be equal to or less than 1,000 nanometers. The cavity IAG may be formed only on the gate electrode GE.

Figure 20:
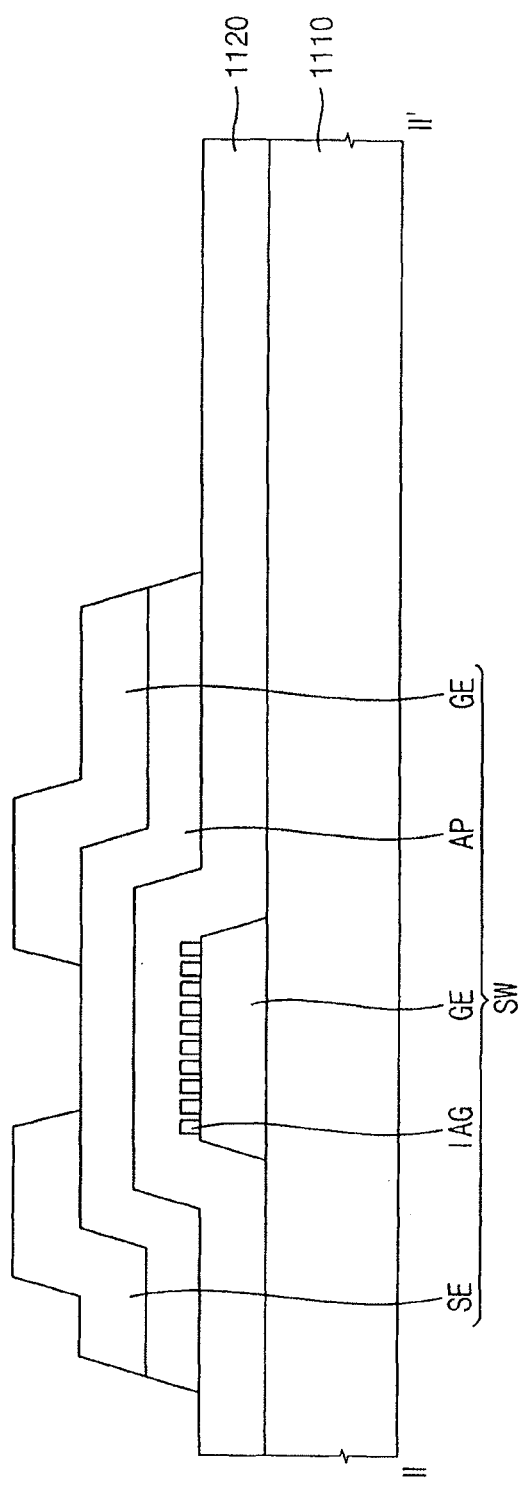

Referring to FIG. 20, the active pattern AP, the source electrode SE, and the drain electrode DE may be formed on the base substrate 1110 on which the gate insulation layer 1120 is formed.

The active pattern AP may be formed on the gate insulation layer 1120. The active pattern AP may include an oxide semiconductor. In an implementation, the oxide semiconductor may include zinc oxide (ZnO), zinc tin oxide (ZTO), zinc indium oxide (ZIO), indium oxide (InO), titanium oxide (TiO), indium gallium zinc oxide (IGZO), or indium zinc tin oxide (IZTO). The above-mentioned materials may be used as a single or may be mixed and used. In an implementation, the oxide semiconductor may include indium gallium zinc oxide.

The source metal pattern may be formed on the active pattern AP. The source metal pattern may include the data line DL, the source electrode SE, and the drain electrode DE. The data line DL may be electrically connected to the source electrode SE. For example, the source electrode SE may protrude from the data line DL in the first direction D1. The data line DL may be formed on the layer on which the source electrode SE and the drain electrode DE are formed.

In an implementation, the source electrode SE and the drain electrode DE may have a single layer structure including, e.g., copper (Cu), silver (Ag), chromium (Cr), molybdenum (Mo), aluminum (Al), titanium (Ti), manganese (Mn), aluminum (Al), or an alloy thereof. In an implementation, the source electrode SE and the drain electrode DE may have a multi layer structure including a plurality of metal layers including materials different from each other.

Referring back to FIG. 14, an organic layer 1140 and the pixel electrode PE may be formed on the base substrate 1110 on which the source electrode SE and the drain electrode DE are formed.

The organic layer 1140 may be formed on the source electrode SE and the drain electrode DE. The organic layer 1140 may substantially planarize the upper surface of the display substrate 1100 so that problems due to a step such as disconnection of a signal line may be prevented. The organic layer 1140 may be an insulation layer including an organic material. For example, the organic layer 1140 may a color filter layer. When the organic layer 1140 is a color filter layer, the color filter layer may be a red color filter layer, a green color filter layer, a blue color filter layer, or a white color filter layer.

The pixel electrode PE may be formed on the organic layer 1140. The pixel electrode PE may include a transparent conductive material. In an implementation, the pixel electrode PE may include indium tin oxide (ITO) or indium zinc oxide (IZO). In an implementation, the pixel electrode PE may include titanium (Ti) and/or molybdenum titanium (MoTi). The pixel electrode PE may be electrically connected to the drain electrode DE through the contact hole CNT.

According to the present exemplary embodiment, the cavities IAG may be defined by the gate electrode GE and the nano-imprint pattern formed on or in the lower surface of the gate insulation layer 1120. The cavities IAG may help decrease or reduce a capacitance between the gate metal layer including the gate electrode GE and the data metal layer including the source electrode SE and the drain electrode DE. Therefore, a line load between the gate metal layer and the data metal layer may be decreased, and a signal delay may be minimized.

Figure 21:
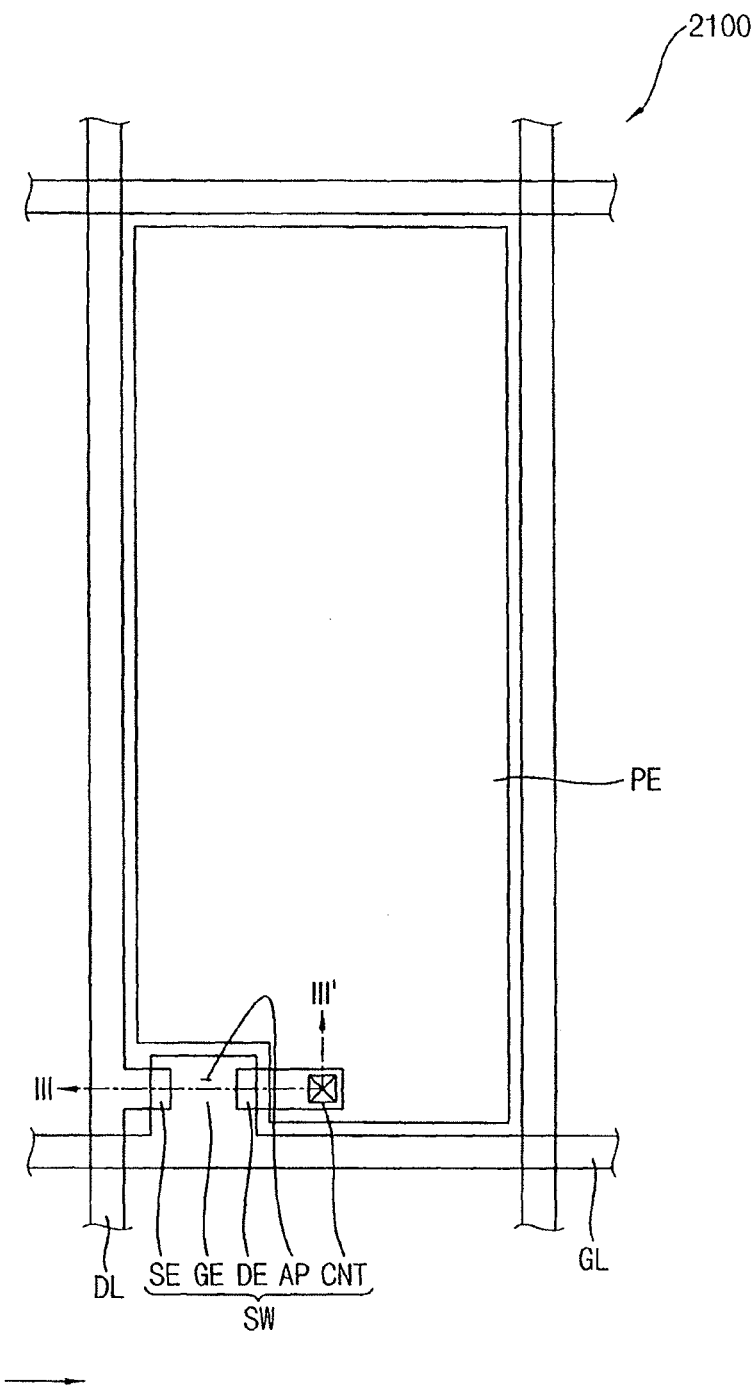
FIG. 21 illustrates a plan view of a display substrate according to an exemplary embodiment.
Figure 22:
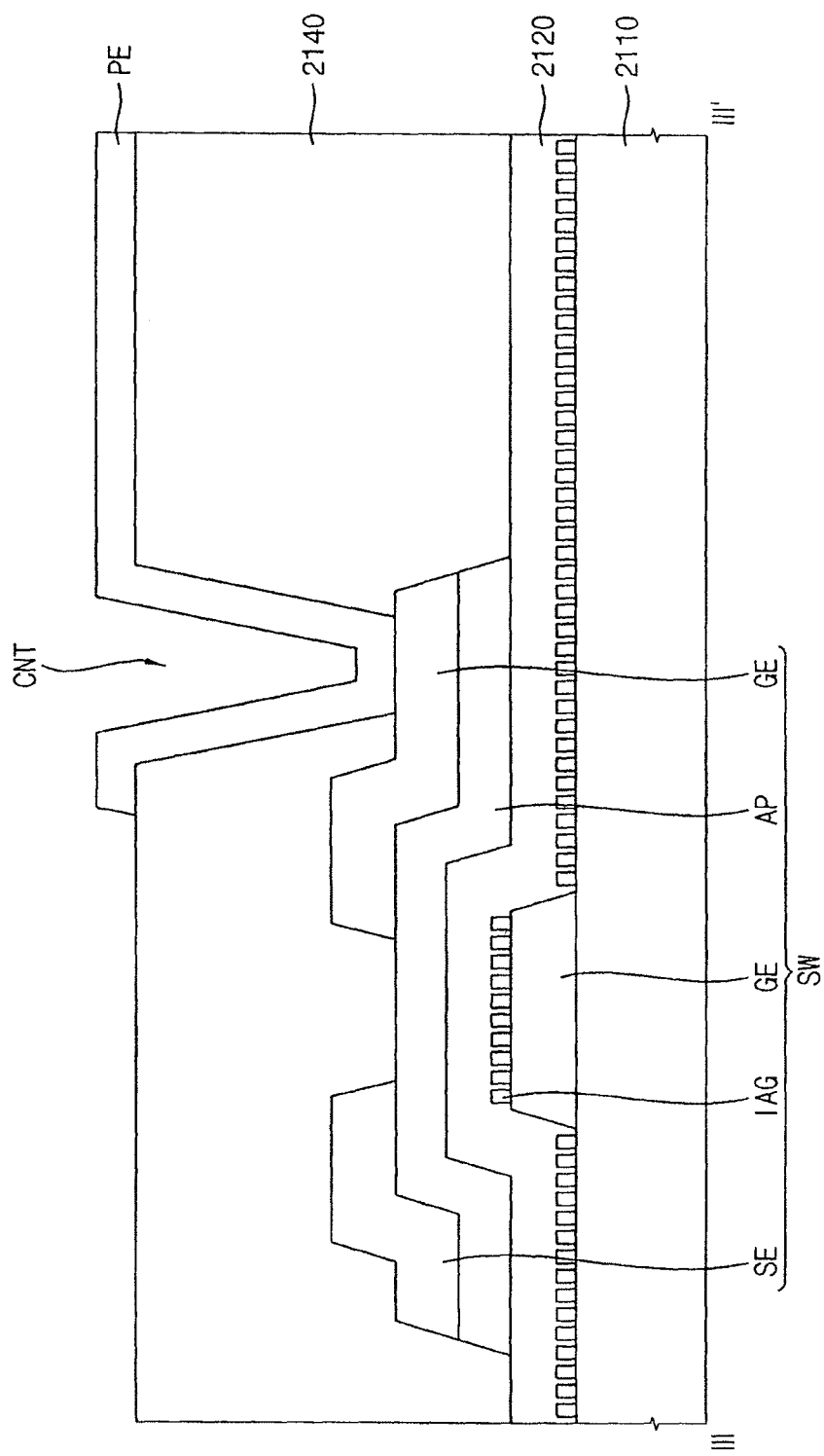
FIG. 22 illustrates a cross-sectional view taken along a line of FIG. 21.

FIG. 21 illustrates a plan view of a display substrate according to an exemplary embodiment. FIG. 22 illustrates a cross-sectional view taken along a line of FIG. 21.

The display substrate 2100 according to the present exemplary embodiment is substantially the same as the display substrate 100 according to the previous exemplary embodiment illustrated in FIGS. 1 to 12 except for a gate electrode GE and a gate insulation layer 2120. Thus, the same reference numerals will be used to refer to same or like parts as those described in the previous exemplary embodiment and any further repetitive explanation concerning the above elements may be omitted.

Referring to FIGS. 21 and 22, the display substrate 2100 according to the present exemplary embodiment may include a gate line GL, a data line DL crossing the gate line GL, a thin film transistor SW which is a switching device, and a pixel electrode PE. The thin film transistor SW may be connected to the gate line GL and the data line DL. The pixel electrode PE may be connected to the thin film transistor SW through a contact hole CNT.

The gate line GL extends in a first direction D1. In an implementation, the gate line GL may have a single layer structure including, e.g., copper (Cu), silver (Ag), chromium (Cr), molybdenum (Mo), aluminum (Al), titanium (Ti), manganese (Mn), or a mixture thereof. In an implementation, the gate line GL may have a multi layer structure having a plurality of metal layers including materials different from each other. The gate line GL is electrically connected to the gate electrode GE of the thin film transistor SW. A portion of the gate line GL may form the gate electrode GE.

The gate insulation layer 2120 is formed on the gate line GL and the gate electrode GE. The gate insulation layer 2120 may include an inorganic material. In an implementation, the gate insulation layer 2120 may include silicon oxide (SiOx) and/or silicon nitride (SiNx). In an implementation, the gate insulation layer 2120 may include silicon oxide (SiOx), and may have a thickness of about 500 Å. In an implementation, the gate insulation layer 2120 may include a plurality of layers including materials different from each other.

The gate insulation layer 2120 may include a nano-imprint pattern formed on a lower surface thereof, e.g., on or in a base substrate facing surface thereof. The gate insulation layer 2120 according to the present exemplary embodiment may include the nano-imprint pattern formed on a whole of (e.g., across or along an entirety of) the lower surface of the gate insulation layer 2120.

The gate electrode GE and the nano-imprint pattern formed on the lower surface of the gate insulation layer 2120 may define a cavity. For example, the cavity may be formed between the gate electrode GE and the gate insulation layer 1120. For example, a base substrate 2110 and the nano-imprint pattern formed on the lower surface of the gate insulation layer 2120 may define a cavity. Thus, the cavity may be formed between the base substrate 2110 and the gate insulation layer 2120.

A width of the cavity (e.g., of each recess of the cavity) may be equal to or greater than 10 nanometers and may be equal to or less than 100 nanometers. A height of the cavity may be equal to or greater than 10 nanometers and may be equal to or less than 1,000 nanometers.

FIGS. 23 to 28 illustrate cross-sectional views of stages in a method of manufacturing the display substrate 2100 of FIG. 22.

Figure 23:
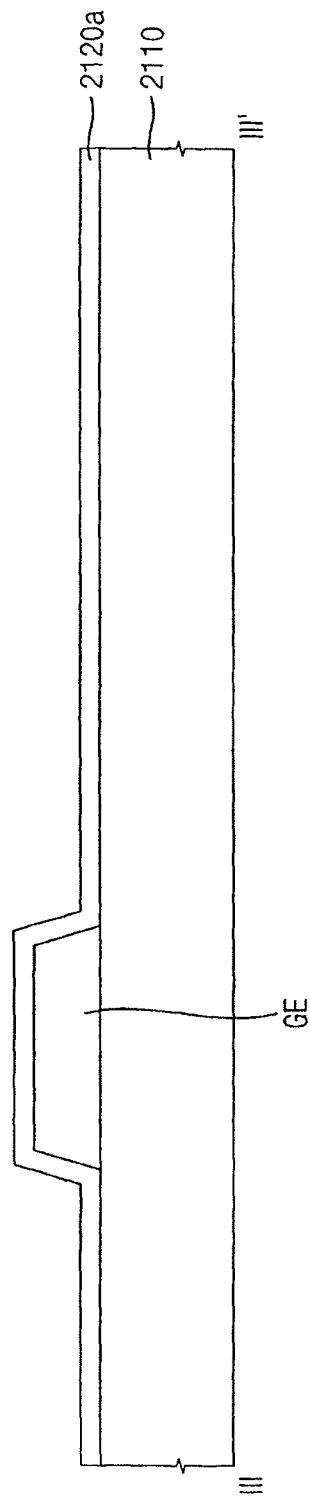
FIGS. 23 to 28 illustrate cross-sectional views of stages in a method of manufacturing the display substrate of FIG. 22.

Referring to FIG. 23, the gate electrode GE and a sub insulation layer 2120a may be formed on the base substrate 2110.

A glass substrate, a quartz substrate, a silicon substrate, a plastic substrate, or the like may be used as the base substrate 2110.

After the gate metal layer is formed on the base substrate 2110, the gate metal layer may be patterned, and the gate electrode GE may be formed.

In an implementation, the gate metal layer may include copper (Cu), silver (Ag), chromium (Cr), molybdenum (Mo), aluminum (Al), titanium (Ti), manganese (Mn), aluminum (Al), or an alloy thereof. In an implementation, the gate metal layer may have a single layer structure or a multi layer structure having a plurality of metal layers including materials different from each other. In an implementation, the gate metal layer may include a copper layer and a titanium layer formed on an upper portion and/or a lower portion of the copper layer.

The sub insulation layer 2120a may include, e.g., silicon nitride, silicon oxide, or the like. The sub insulation layer 2120a may have a single layer structure or a multi layer structure. For example, the sub insulation layer 2120a may include a lower insulation layer having silicon nitride and an upper insulation layer having silicon oxide.

Figure 24:
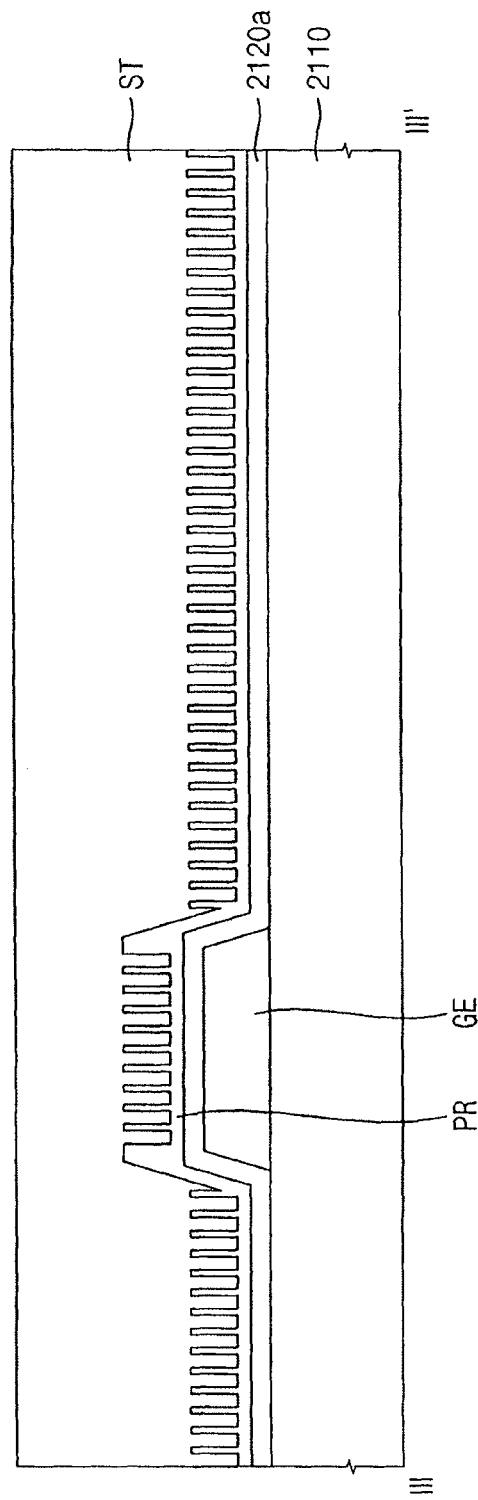

Referring to FIG. 24, a resin layer PR may be formed on the base substrate 2110 on which the gate electrode GE and the sub insulation layer 2120a have been formed. A primitive or preliminary pattern may be formed using an imprint mold ST. Thus, an imprint may be progressed.

A resin solution of the resin layer PR may have low viscosity, and the primitive pattern may be formed between the imprint mold ST and the sub insulation layer 2120a by a capillary tube phenomenon.

The imprint mold ST may include a mold pattern positioned in a portion corresponding to or overlying the gate electrode GE, as well as other portions of the sub-insulation layer 2120a. The imprint mold ST may include a transparent material to transmit ultraviolet rays. The mold pattern may have a shape inverted or complementary to the primitive pattern. For example, in order to form the primitive pattern corresponding to a wire grid pattern, the mold pattern may include protrusion patterns formed in a regular interval and having the same shapes.

Next, ultraviolet rays may be emitted to the primitive pattern, and the resin solution of the primitive pattern may be hardened. The imprint mold ST may transmit the ultraviolet rays, the ultraviolet rays may reach the primitive pattern through the imprint mold ST, and thus the resin solution of the primitive pattern may be hardened. Next, the imprint mold ST may be separated from the base substrate 2110, and thus the primitive pattern may be formed.

Figure 25:
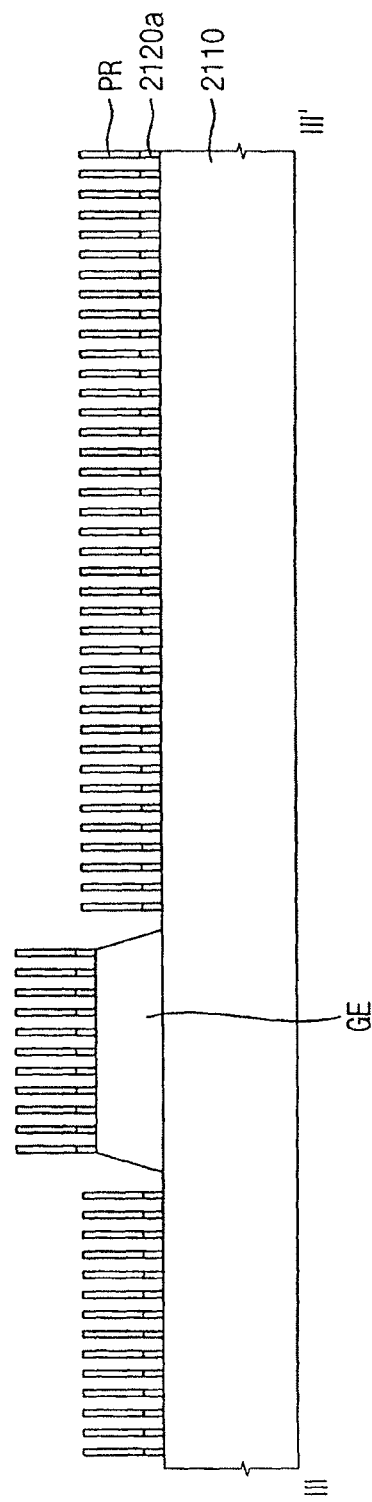

Referring to FIG. 25, the sub insulation layer 2120a is etched using the primitive pattern PR as a mask.

The sub insulation layer 2120a may be etched using the primitive pattern PR as a mask. The etching may be include performing a dry etch method. At this time, an amount control of the etching may be important. A nano-imprint pattern may be formed on the sub insulation layer 2120a by controlling the amount of the etching.

Figure 26:
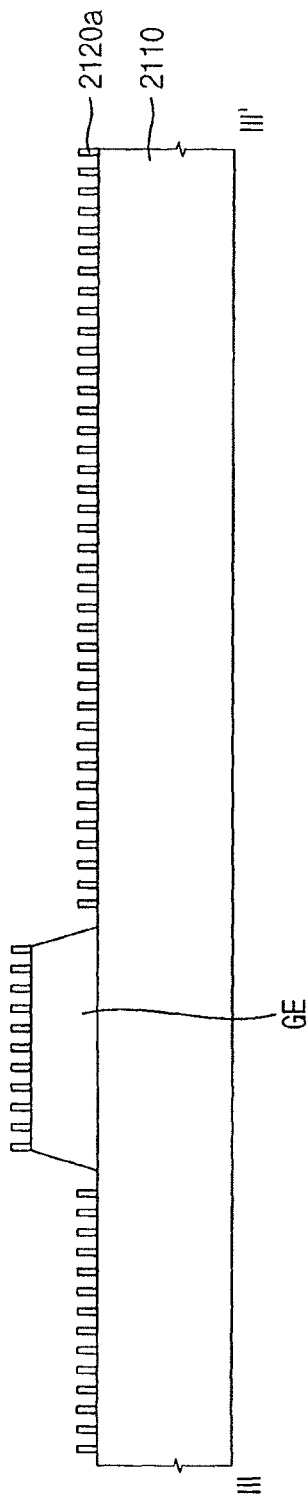

Referring to FIG. 26, the primitive pattern PR may be removed.

The primitive pattern PR may be removed. Thus, the sub insulation layer 2120a on which the nano-imprint pattern may be formed is exposed.

A width of the nano-imprint pattern formed on the sub insulation layer 2120a (e.g., a distance between portions of the nano-imprint pattern) may be equal to or greater than 10 nanometers and may be equal to or less than 100 nanometers. In an implementation, a height of the nano-imprint pattern formed on the sub insulation layer 2120a may be equal to or greater than 10 nanometers and may be equal to or less than 1,000 nanometers. The nano-imprint pattern may be formed on the gate electrode GE and on the base substrate 2110 (e.g., at sides of the gate electrode GE).

Figure 27:
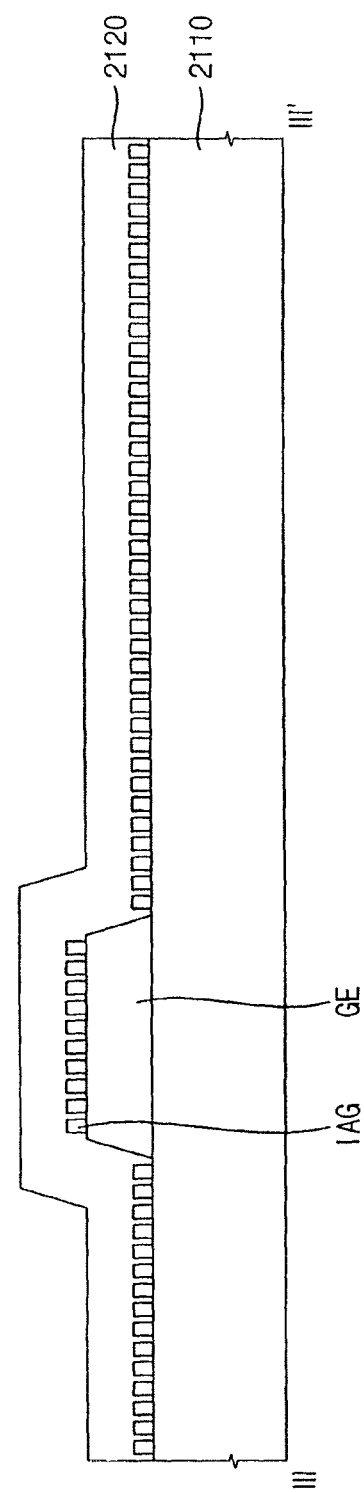

Referring to FIG. 27, the gate insulation layer 2120 may be formed on the base substrate 2110 on which the nano-imprint pattern has been formed. The gate insulation layer 2120 may include, e.g., silicon nitride, silicon oxide, or. The gate insulation layer 2120 may have a single layer structure or a multi layer structure. For example, the gate insulation layer 2120 may include a lower insulation layer having silicon nitride and an upper insulation layer having silicon oxide.

A plurality of cavities IAG may be defined by the gate electrode GE and the nano-imprint pattern formed on the lower surface of the gate insulation layer 2120, and the base substrate 2110 and the nano-imprint pattern formed on the lower surface of the gate insulation layer 2120.

The width of the cavity IAG (e.g., of each cavity) may be equal to or greater than 10 nanometers and may be equal to or less than 100 nanometers. In an implementation, the height of the cavity IAG may be equal to or greater than 10 nanometers and may be equal to or less than 1,000 nanometers. The cavity IAG may be formed on the gate electrode GE and the base substrate 2110. For example, the cavity IAG may include a plurality of discontinuous cavities, or may include a continuous cavity.

Figure 28:
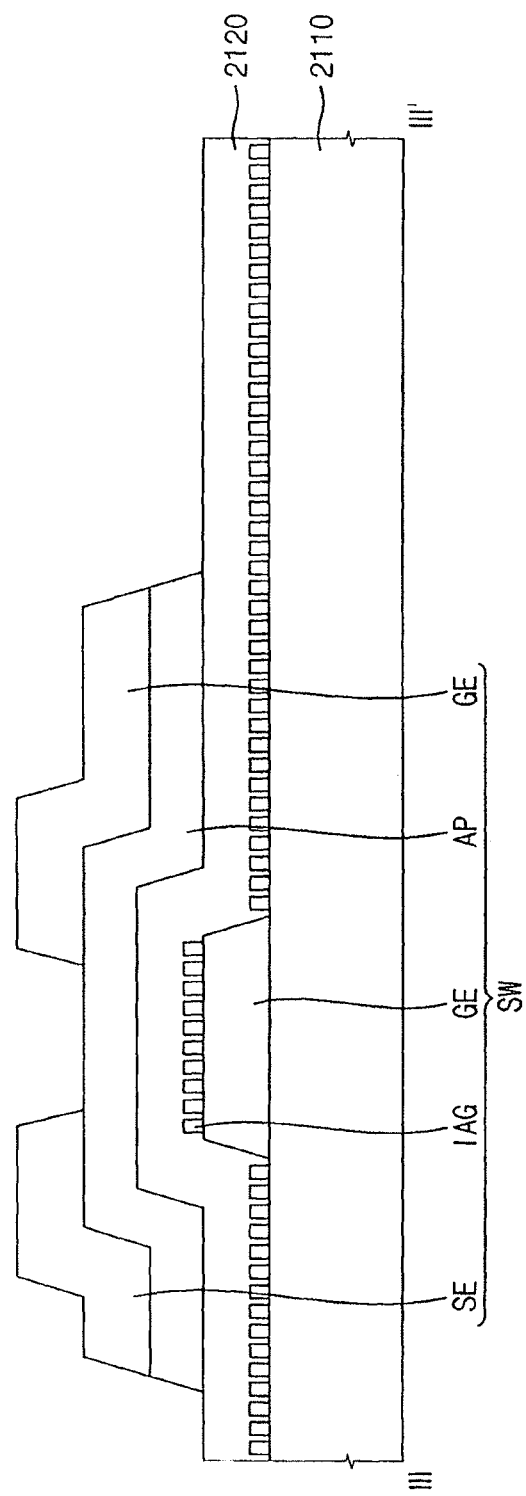

Referring to FIG. 28, the active pattern AP, the source electrode SE, and the drain electrode DE may be formed on the base substrate 2110 on which the gate insulation layer 2120 is formed.

The active pattern AP may be formed on the gate insulation layer 2120. The active pattern AP may include an oxide semiconductor. For example, the oxide semiconductor may include zinc oxide (ZnO), zinc tin oxide (ZTO), zinc indium oxide (ZIO), indium oxide (InO), titanium oxide (TiO), indium gallium zinc oxide (IGZO), or indium zinc tin oxide (IZTO). The above-mentioned materials may be used as a single or may be mixed and used. In an implementation, the oxide semiconductor may include indium gallium zinc oxide.

The source metal pattern may be formed on the active pattern AP. The source metal pattern may include the data line DL, the source electrode SE, and the drain electrode DE. The data line DL may be electrically connected to the source electrode SE. For example, the source electrode SE may protrude from the data line DL in the first direction D1. The data line DL may be formed on the layer on which the source electrode SE and the drain electrode DE are formed.

The source electrode SE and the drain electrode DE may have a single layer structure including, e.g., copper (Cu), silver (Ag), chromium (Cr), molybdenum (Mo), aluminum (Al), titanium (Ti), manganese (Mn), aluminum (Al), or an alloy thereof. In an implementation, the source electrode SE and the drain electrode DE may have a multi layer structure including a plurality of metal layers including materials different from each other.

Referring back to FIG. 22, an organic layer 2140 and the pixel electrode PE may be formed on the base substrate 2110 on which the source electrode SE and the drain electrode DE have been formed.

The organic layer 2140 may be formed on the source electrode SE and the drain electrode DE. The organic layer 2140 may substantially planarize the upper surface of the display substrate 2100 so that problems due to a step such as disconnection of a signal line may be prevented. The organic layer 2140 may be an insulation layer including an organic material. For example, the organic layer 2140 may a color filter layer. When the organic layer 2140 is a color filter layer, the color filter layer may be a red color filter layer, a green color filter layer, a blue color filter layer, or a white color filter layer.

The pixel electrode PE may be formed on the organic layer 2140. The pixel electrode PE may include a transparent conductive material. For example, the pixel electrode PE may include indium tin oxide (ITO) or indium zinc oxide (IZO). In an implementation, the pixel electrode PE may include titanium (Ti) and/or molybdenum titanium (MoTi). The pixel electrode PE may be electrically connected to the drain electrode DE through the contact hole CNT.

According to the present exemplary embodiment, the cavities IAG may be defined by the gate electrode GE and the nano-imprint pattern formed on the lower surface of the gate insulation layer 2120, and the base substrate 2110 and the nano-imprint pattern formed on the lower surface of the gate insulation layer 2120. The cavities IAG may help decrease or reduce a capacitance between the gate metal layer including the gate electrode GE and the data metal layer including the source electrode SE and the drain electrode DE. Therefore, a line load between the gate metal layer and the data metal layer may be decreased, and a signal delay may be minimized.

By way of summation and review, in a display panel, the data line may overlap the gate line, and thus a capacitance may be generated between the data line and the gate line. The generated capacitance could cause a delay of a signal.

The embodiments may provide a display substrate capable of decreasing a signal delay.

According to an embodiment, a display substrate may include a plurality of cavities formed between a gate electrode and a gate insulation layer and/or between a base substrate and the gate insulation layer. The cavities may help decrease a capacitance between a gate metal layer including a gate electrode and a data metal layer including a source electrode and a drain electrode. Therefore, a line load between the gate metal layer and the data metal layer may be decreased, and thus a signal delay may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display substrate, comprising:
   a base substrate;
   a gate electrode on the base substrate;
   an insulation layer on the gate electrode;
   a source electrode and a drain electrode on the insulation layer and overlapping the gate electrode;
   a pixel electrode electrically connected to the drain electrode; and
   a pattern present between the gate electrode and the insulation layer, the pattern including a plurality of regularly-arranged recesses with each recess having a width and a height with the width of each recess spanning a first direction defined along an axis extending between the source electrode and the drain electrode and parallel with a planar surface of the base substrate,
   wherein the height of each recess of the pattern is less than a thickness of the gate electrode and less than a thickness of the insulation layer, and
   wherein a width of each recess of the pattern is equal to or greater than 10 nanometers and is equal to or less than 100 nanometers, wherein
   at least a portion of a lower surface of the insulation layer is spaced apart from the gate electrode in a height direction by each recess of the pattern, wherein
   the gate electrode includes the pattern in an upper surface thereof.

2. The display substrate as claimed in claim 1, wherein the height of each recess of the pattern is equal to or greater than 10 nanometers and is equal to or less than 1,000 nanometers.

3. The display substrate as claimed in claim 1, wherein the plurality of regularly-arranged recesses are arranged to decrease capacitance between the gate electrode and at least one of the source electrode and the drain electrode.

4. The display substrate as claimed in claim 3, wherein the plurality of regularly-arranged recesses are arranged to decrease capacitance between the gate electrode and both of the source electrode and the drain electrode.

* * * * *